United States Patent
Monget et al.

(10) Patent No.: US 6,271,144 B1
(45) Date of Patent: *Aug. 7, 2001

(54) PROCESS FOR ETCHING A POLYCRYSTALLINE $SI_{(1-x)}GE_{(x)}$ LAYER OR A STACK OF POLYCRYSTALLINE $SI_{(1-x)}GE_{(x)}$ LAYER AND OF A POLYCRYSTALLINE SI LAYER, AND ITS APPLICATION TO MICROELECTRONICS

(75) Inventors: Cédric Monget, Grenoble; Sophie Vallon, Versailles; Olivier Joubert, Meylan, all of (FR)

(73) Assignee: France Telecom, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 09/103,121

(22) Filed: Jun. 23, 1998

(30) Foreign Application Priority Data

Jun. 25, 1997 (FR) .................................................. 97 07940

(51) Int. Cl.⁷ .................................................. H01L 21/302
(52) U.S. Cl. ........................ 438/706; 719/723; 719/743; 252/79.1
(58) Field of Search .................. 438/706, 719, 438/723, 743; 252/79.1

(56) References Cited

U.S. PATENT DOCUMENTS

| | | | |
|---|---|---|---|
| 5,461,250 | * 10/1995 | Burghartz et al. | 257/347 |
| 5,521,108 | 5/1996 | Rostoker et al. | 438/260 |
| 5,665,203 | * 9/1997 | Lee et al. | 438/585 |
| 5,998,289 | * 12/1999 | Sagnes | 438/592 |

FOREIGN PATENT DOCUMENTS

| | | | |
|---|---|---|---|
| 0 212 585 A2 | 3/1987 | (EP) | H01L/21/306 |
| 0 746 015 A2 | 12/1996 | (EP) | H01L/21/3065 |

OTHER PUBLICATIONS

Richter et al., "Optical emission end point detection for reactive ion etching of Si/SiGe structures." Materials Science and Engineering, vol. 27, No. 1, pp. 39–45, Oct. 1994.*

International Search Report for FR9707940 dated Feb. 24, 1998.

* cited by examiner

*Primary Examiner*—Benjamin L. Utech
*Assistant Examiner*—Lynette T. Umez-Eronini
(74) *Attorney, Agent, or Firm*—Conley, Rose & Tayon, PC

(57) ABSTRACT

The process for etching a polycrystalline $Si_{1-x}Ge_x$ layer or a stack includes a polycrystalline $Si_{1-x}Ge_x$ layer and of a polycrystalline Si layer, deposited on a substrate and including, at its surface, a mask of inorganic material, includes main etching step in which the said layer or the said stack is anisotropically etched, using the said mask, by means of a high-density gas plasma of a gas mixture consisting of chlorine ($Cl_2$) and of either nitrogen ($N_2$) or ammonia ($NH_3$) or of a nitrogen/ammonia mixture.

26 Claims, 6 Drawing Sheets

PROCESS FOR ETCHING A POLYCRYSTALLINE $SI_{(1-x)}GE_{(x)}$ LAYER OR A STACK OF POLYCRYSTALLINE $SI_{(1-x)}GE_{(x)}$ LAYER AND OF A POLYCRYSTALLINE SI LAYER, AND ITS APPLICATION TO MICROELECTRONICS

The present invention relates in a general way to the field of high-density plasma etching for the production of submicron structures used in microelectronics.

More particularly, a process for anisotropically etching an $Si_{1-x}Ge_x(0<x\leq1)$ layer and, in particular, a stack of layers comprising an $Si_{1-x}Ge_x$ first layer and, on this first layer, a silicon second layer, by high-density plasma is herein described.

The material generally used for forming the gate of a CMOS semiconductor device, in particular in the case of devices with a short channel, $\leq 0.18$ μm, is amorphous silicon (a-Si). Conventionally, the gates of these devices are obtained by high-density plasma etching an a-Si layer deposited on a thin silicon oxide layer (gate oxide) formed on the surface of a silicon substrate. This etching step must be anisotropic in order for the side walls of the a-Si feature finally obtained to be perfectly straight so as to meet the size imposed by the mask defined beforehand by a photolithography step. Moreover, and this is one of the main difficulties with the step of etching the gate of a CMOS device, the subjacent silicon oxide must not be punctured so as not to damage the future active regions of the device, which means that the consumption of silicon oxide must be as low as possible.

The actual etching step includes exposing the layer of material to be etched, for example a-Si, on which a masking pattern has been formed beforehand by photolithography, to a reactive plasma using a gas or a gas mixture which reacts chemically with the material to be etched in order to form volatile reaction products which desorb spontaneously or under the influence of the ion bombardment. The etching kinetics observed in plasmas depend, on the one hand, on a phenomenon of dissociation of the gas or gas mixture which generates the reactive atomic species and, on the other hand, on the ionization of the gas or gas mixture which produces positive ions allowing ion bombardment normal to the surface of the substrate which is at a negative potential with respect to the potential of the plasma.

The actual etching operation is induced by the plasma, the etching action of which may be decomposed into a vertical etch rate Vv of direction normal to the surface of the substrate and a spontaneous lateral etch rate Vl, directed towards the etching side walls not exposed to the ion bombardment.

In practice, in order to obtain an anisotropic etching profile, it is known that the ion bombardment must be intense and of high energy so as to favour the vertical etch rate Vv enhanced by the ion bombardment and to minimize the spontaneous lateral etch rate Vl, i.e. the spontaneous etching reactions between etching side walls and reactive species in the plasma. Etching anisotropy is obtained in some cases by forming a thin passivation layer on the side walls of the etched feature, thereby protecting the side walls of the etched feature from being spontaneously etched by the reactive species produced by the discharge.

In the specific case of etching a-Si, it is necessary to obtain, on the one hand, aniosotropic etching and, on the other hand, to minimize the consumption of gate oxide. The processes for etching a-Si generally includes three steps.

The first step, during which the bias energy applied to the substrate is high (typically, in an industrial high-density plasma source whose ion density is between $5\times10^{11}$ and $10^{12}$ ions/cm³, the bias power applied to a 200 mm diameter substrate is 400 W), makes it possible to etch the thin native silicon oxide layer which forms naturally on the surface of a-Si exposed to air.

The second step, which is called the main etching step, makes it possible to obtain the anisotropy of the etching profile: the bias power for a 200 mm diameter substrate is then between 100 and 150 W, depending on the high-density plasma sources used.

The third step is only initiated when an end-of-etch detection signal is obtained at the completion of the main etching step and therefore only when the entire a-Si is etched in the open regions of the substrate (i.e., the featureless regions). This step, which is called the overetching step, is necessary in order to complete the etching in the dense regions of the substrate, i.e. those regions in which the gates may be separated by a distance of less than 0.5 micrometres. This is because, in these dense regions, the a-Si etch rate may be up to 20–30% lower than in the open regions. The overetching step must therefore be long enough to allow the a-Si remaining after the main etching step to be etched, whatever the point on the substrate. In practice, its duration represents 50% of the time for the main etching step and may be extended up to 100% in the case of topographically severe substrates. During this step, the gate oxide is exposed to the plasma in the open regions. The plasma conditions must therefore be adjusted so as not to damage it. In practice, the bias power applied to the 200 mm diameter substrate is reduced to values below 60 W so as to decrease the ion energy substantially and there-ore to increase the selectivity between the a-Si and the silicon oxide (the selectivity is defined as the ratio of the etch rates).

The chemistry used for etching the amorphous silicon generally uses gases such as $Cl_2$, HBr, HCl, $Br_2$. In order to preserve the gate oxide, $O_2$ is added to the gas phase (during the overetching step or possibly during the entire process) in order to increase the a-Si/gate oxide selectivity. The most commonly employed chemistries for etching a-Si are the mixtures $HBr/Cl_2/O_2$ and $HBr/O_2$. Each gas in the mixture has a very precise role: chlorine is used to obtain a high etch rate and is conducive to the creation of anisotropic etching profiles (atomic chlorine, produced by the discharge, does not react spontaneously with the a-Si of the etching side wall). One of the drawbacks of using chlorine is that it increases the etch rate of a-Si at the edge of the gates (a phenomenon more widely known in plasma etching as "trenching"). As a result, the silicon oxide at the edge of the gate may be exposed to the plasma before the end-of-etch detection signal for the main etching step. In the case of very thin (thickness <5 nm) gate silicon oxide layers, this increase in the etch rate at the edge of the gates may puncture the oxide at the edge of the gates. The addition of HBr to the gas phase allows this phenomenon to be reduced. This is because adding HBr (which produces this phenomenon to a lesser extent than chlorine) allows the partial pressure of chlorine in the gas phase to be decreased and therefore the magnitude of the phenomenon to be decreased. HBr also allows the a-Si/gate oxide selectivity to be substantially increased. Oxygen, which markedly improves the a-Si/gate oxide selectivity, is also conducive to the formation of a passivation layer which protects the a-Si side walls during etching. This passivation layer is a highly chlorinated substoichiometric oxide whose composition is approximately SiOCl. The exact composition and the thickness of this oxide may depend on the high-density plasma source used and on the gas mixture, but the etching of a-Si is always anisotropic when this passivation layer is formed on the etching side walls.

It has been proposed to replace amorphous silicon as the material for the gate of a CMOS semiconductor device, in particular for the fabrication of devices with a short ($\leq 0.18$ µm) channel, with a stack of a polycrystalline silicon-germanium ($Si_{1-x}Ge_x$, $0<x\leq 1$) first layer deposited directly on the gate oxide. A silicon, for example polycrystalline silicon, second layer is generally deposited on this polycrystalline silicon-germanium first layer. The essential advantage of replacing the a-Si layer with this polycrystalline silicon-germanium/silicon (poly $Si_{1-x}Ge_x$/Si) stack is that a gate is obtained which, using a single $p^+$ doping, replaces the twin, $n^+$ and $p^+$, gates used for obtaining PMOS and NMOS devices.

As in the case of etching an a-Si layer, the process of etching the poly $Si_{1-x}Ge_x$/Si stack must be anisotropic and the etching profile must be straight both in the poly $Si_{1-x}Ge_x$ layer and in the Si layer.

Unfortunately, as will be shown below, the high-density plasma etching processes conventionally used for etching a-Si are not suitable for etching a poly $Si_{1-x}Ge_x$ layer or a poly $Si_{1-x}Ge_x$/Si stack, in particular when the germanium content of the poly $Si_{1-x}Ge_x$ layer is greater than 50% ($x\geq 0.5$). This is because the conventional plasma etching processes lead to deformation of the profiles of the etched features, in particular of the side walls of the latter.

The subject of the present invention is therefore a process for etching a poly $Si_{1-x}Ge_x$ layer which remedies the above drawbacks and, in particular, which avoids etching the side walls of the features formed is herein described.

The subject of the invention is also a process for etching a poly $Si_{1-x}Ge_x$/poly Si stack which remedies the above drawbacks and, in particular, avoids etching the side walls of the features formed is also described.

According to the invention, a process is provided for etching an $Si_{1-x}Ge_x$ ($0<x\leq 1$) layer deposited on a substrate and including, at its surface, a mask made of inorganic material, characterized in that it includes a main etching step in which the $Si_{1-x}Ge_x$ layer is anisotropically etched, using the said mask, by means of a high-density gas plasma of a gas mixture that includes $Cl_2$ and either $N_2$ or $NH_3$ or a $N_2/NH_3$ mixture.

In another embodiment, a process is provided for etching a stack of layers on a substrate, the stack including a polycrystalline $Si_{1-x}Ge_x$ first layer deposited on the substrate and a silicon second layer on the first layer and including, at its surface, a mask of inorganic material, characterized in that it includes a main etching step in which the said stack is anisotropically etched, using the said mask, by means of a high-density gas plasma of a gas mixture that includes $Cl_2$ and either $N_2$ or $NH_3$ or a $N_2/NH_3$ mixture.

Figure 1:
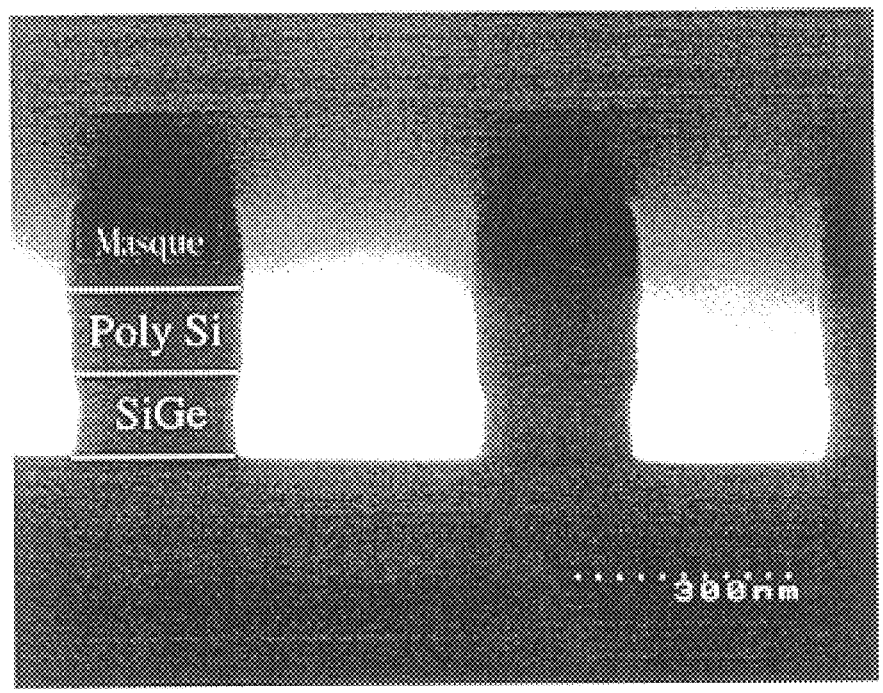
FIGS. 1–6 depict cross-sectional views of a semiconductor substrate after plasma etching of a stack.

The etching process is particularly suitable for etching a polycrystalline $Si_{1-x}Ge_x$ layer or a stack comprising a polycrystalline $Si_{1-x}Ge_x$ first layer having a germanium content of 50% or more ($x\geq 0.5$), including a layer of pure polycrystalline germanium ($x=1$), and preferably having a germanium content of between 70% and 100% ($0.70\leq x\leq 1$) and better still between 75% and 100% ($0.75\leq x\leq 1$).

If the stack is intended to form the gate structure of a CMOS semiconductor device, the poly $Si_{1-x}Ge_x$ layer generally has a thickness of between 25 and 200 nm and preferably 30 to 190 nm, whereas the Si layer may have a thickness ranging up to 200 nm and preferably between 50 and 100 nm.

Preferably, the total thickness of the stack is between 150 and 200 nm, a thickness of 200 nm being particularly recommended in the case of devices with a short ($\leq 0.18$ µm) channel.

The polycrystalline silicon-germanium layer or the layers of the stack may be doped layers, for example doped with boron or phosphorous atoms, as is well known in the technique of fabricating CMOS semiconductor devices.

Prior to the main etching step, according to the invention, a mask of inorganic material is conventionally formed, by depositing an inorganic material, for example a $SiO_2$ layer or a $SiO_2$/SiON double layer, using a conventional process such as low-pressure chemical vapour deposition.

After a conventional resin mask has been formed, for example by photolithography, on this layer of inorganic material, the mask of inorganic material is etched, preferably by high-density plasma etching.

One characteristic of the process includes a main, anisotropic, etching step, using a chlorine-based high-density gas plasma which contains no oxygen or HBr and which includes $N_2$ or $NH_3$ or a mixture thereof, in order to form a passivation layer on the etching side walls by co-adsorption with atomic chlorine so as to reduce the chlorine-induced spontaneous side etch rate Vl. This addition of $N_2$ or $NH_3$, or of a mixture of these compounds, results in few or no etching residues, and does not cause lateral erosion or impairment of the poly $Si_{1-x}Ge_x$ layer or of the subjacent gate oxide. Furthermore, the use of such a gas mixture is compatible with industrial methods of implementing the etching process.

The proportions of $N_2$ and/or $NH_3$ introduced into the gas mixture of the plasma may be determined experimentally in a conventional manner and must be sufficient to block the kinetics of the spontaneous chemical reactions responsible for a lateral etching of the side walls of the etched features not exposed to the ion bombardment, without correspondingly blocking the kinetics of the reactions induced by the ion bombardment responsible for the vertical etching.

Preferably, in the process of the present invention, the main etching step is followed by an overetching step, as in the case of etching an amorphous silicon layer, in which the energy of the ions in the plasma is lower than in the main etching step. During this overetching step, it is possible to use the same gas mixture as in the main etching step, but it is also possible to use gas mixtures containing oxygen, since the passivation layer formed on the side walls of the feature etched during the main etching step using the gas mixture containing no oxygen or HBr protects the side walls of the etched feature from being spontaneously etched by the oxygen atoms during this overetching step. This overetching step is generally carried out under substrate-bias conditions, in which the power does not exceed 60 W.

The amount of oxygen may be determined experimentally in order to increase the poly $Si_{1-x}Ge_x$/gate oxide selectivity without causing spontaneous lateral etching of the etched features.

Also preferably, the main etching step is stopped before the substrate, for example the subjacent silicon oxide layer, is reached, preferably at a distance of between 30 and 40 nm from the subjacent substrate. Thus, any risk of damaging the subjacent substrate, in particular the gate oxide, during the main etching step is avoided.

COMPARATIVE EXAMPLE A

A stack that includes a polycrystalline $Si_{0.45}Ge_{0.55}$ first layer (120 nm thick) and a polycrystalline silicon second layer (80 nm thick) is formed on a silicon oxide layer of a substrate in a conventional manner. A masking layer made of an inorganic material, for example a silicon oxide layer, is deposited on the polycrystalline silicon second layer.

After conventionally forming a resin mask on the masking layer of inorganic material and after etching the mask of inorganic material using a plasma based on fluorocarbon gases and after removing the masking resin, the stack is etched under the conditions indicated in Table I below.

TABLE I

| | | Plasma | | |
|---|---|---|---|---|
| | Gas mixture | Power of the source (W) | Bias power applied to the substrate holder (W) | Treatment time (s) |
| Puncture of the oxide layer on the surface of the polycrystalline silicon | HBr/Cl$_2$/O$_2$ (40/40/8)* | 2500 | 400 | 5 |
| Main etching step | HBr/Cl$_2$/O$_2$ (40/40/8) | 2500 | 150 | 52 |
| Overetching step | HBr/O$_2$ (60/8) | 2500 | 60 | 26 |

*In the examples, except where otherwise indicated, all the gas flow rates are expressed in cm$^3$/minute under standard conditions.

As shown in FIG. 1, which is a photomicrograph of the stack after etching, significant deformation of the etching profile of the features in the side walls of the polycrystalline Si$_{0.45}$Ge$_{0.55}$ layer is observed. Analysis by X-ray photoelectron spectroscopy of the thickness of the oxide layer which passivates the side walls of the etched features shows that this layer has a thickness of 1 nm on the side walls of the polycrystalline Si$_{0.45}$Ge$_{0.55}$ layer as compared with 3 nm on the side walls of the polycrystalline silicon layer.

As in the case of polycrystalline silicon, the passivation layer on the Si$_{0.45}$Ge$_{0.55}$ side walls is a highly chlorinated substoichiometric silicon oxide. The passivation layer is therefore formed only from silicon-etching reaction products, which explains why its thickness on the side wall of the etched feature decreases in the case of the Si$_{0.45}$Ge$_{0.55}$ layer.

COMPARATIVE EXAMPLES B AND C

By carrying out the process in a similar way to Comparative Example A, but using the conditions in Table II below, two stacks similar to that in Comparative Example A are etched, but in which the polycrystalline Si$_{0.45}$Ge$_{0.55}$ first layer is replaced by a polycrystalline Si$_{0.25}$Ge$_{0.75}$ layer and a polycrystalline Ge layer, respectively.

TABLE II

| | | Plasma | | |
|---|---|---|---|---|
| | Gas mixture | Power of the source (W) | Bias power applied to the substrate holder (W) | Treatment time (s) |
| Puncture of the oxide layer on the surface of the polycrystalline silicon | Cl$_2$/O$_2$ (80/8) | 2500 | 400 | 5 |
| Main etching step (stopped 30–40 nm before reaching the silicon oxide of the substrate) | Cl$_2$/O$_2$ (80/8) | 2500 | 150 | 13 |
| Overetching step | Cl$_2$/O$_2$ (60/8) | 2500 | 60 | 23 |

Figure 2:
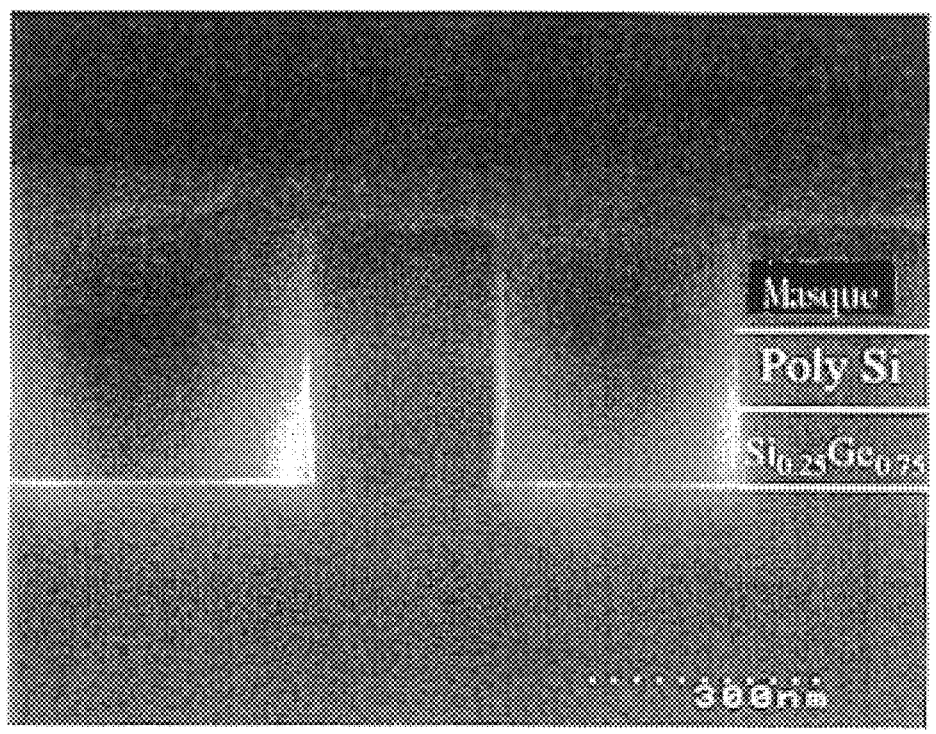
Figure 3:
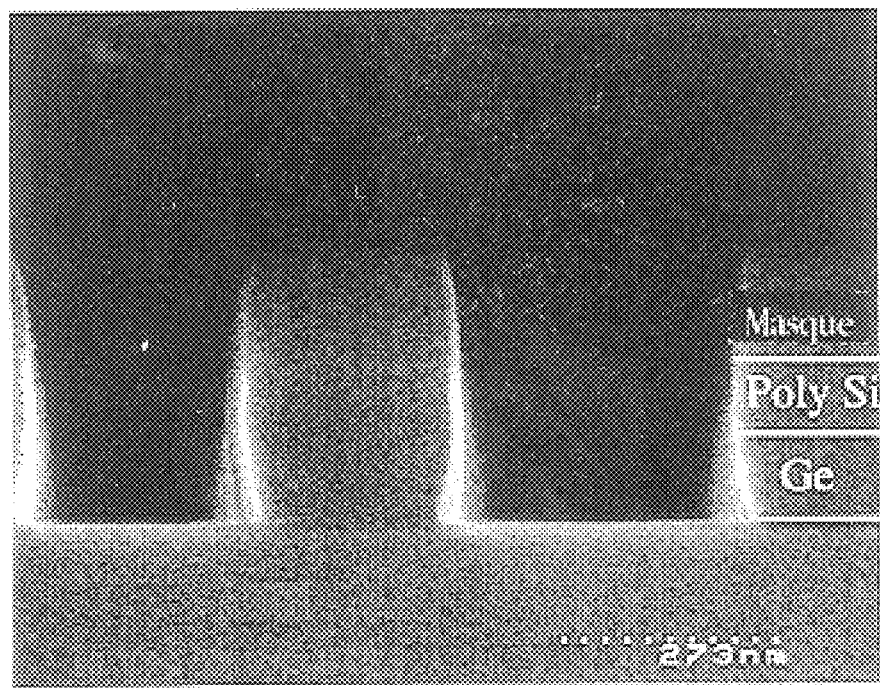

As shown in FIG. 2 (Comparative Example B) and FIG. 3 (Comparative Example C), which are photomicrographs similar to FIG. 1, the etching profiles in the polycrystalline Si$_{0.25}$Ge$_{0.75}$ and polycrystalline Ge layers are deformed.

Thus, eliminating HBr is not enough to avoid deformation of the profiles, in particular in the case of high germanium contents of the polycrystalline Si$_{1-x}$Ge$_x$ layer.

COMPARATIVE EXAMPLE D

Comparative Example C was repeated, but by eliminating oxygen from the gas mixture of plasma.

Figure 4:
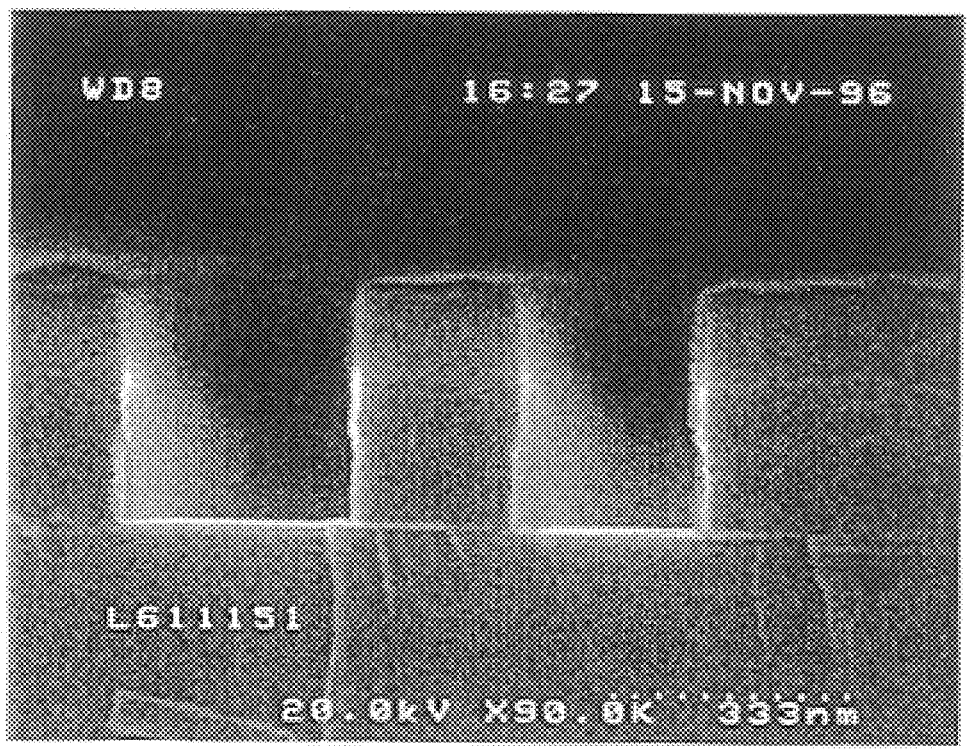

FIG. 4 shows that the etching profile is perfectly straight in the polycrystalline silicon layer, whereas it may be seen that the polycrystalline germanium layer is deformed, showing that the neutral chlorine atoms spontaneously attack the polycrystalline germanium.

EXAMPLES 1 AND 2

By carrying out the process in a similar manner to Comparative Examples B and C, but using the conditions in Table III below, two stacks including a polycrystalline Si$_{0.25}$Ge$_{0.75}$/polycrystalline Ge first layer and a polycrystalline silicon layer, respectively, were etched.

TABLE III

| | | Plasma | | |
|---|---|---|---|---|
| | Gas mixture | Power of the source (W) | Bias power applied to the substrate holder (W) | Treatment time (s) |
| Puncture of the oxide layer on the surface of the polycrystalline silicon | Cl$_2$/N$_2$ (73/7) | 2500 | 400 | 5 |
| Main etching step (stopped 30–40 nm before reaching the silicon oxide of the substrate) | Cl$_2$/N$_2$ (73/7) | 2500 | 150 | 13 |
| Overetching step | Cl$_2$/N$_2$ (60/7) | 2500 | 60 | 23 |

Figure 5:
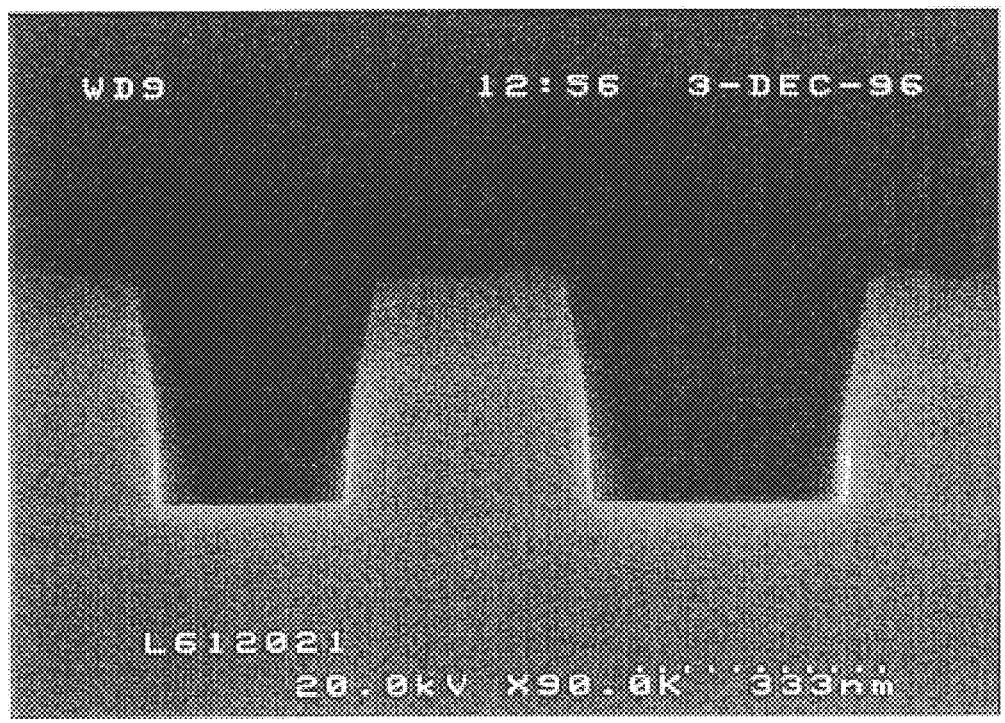
Figure 6:
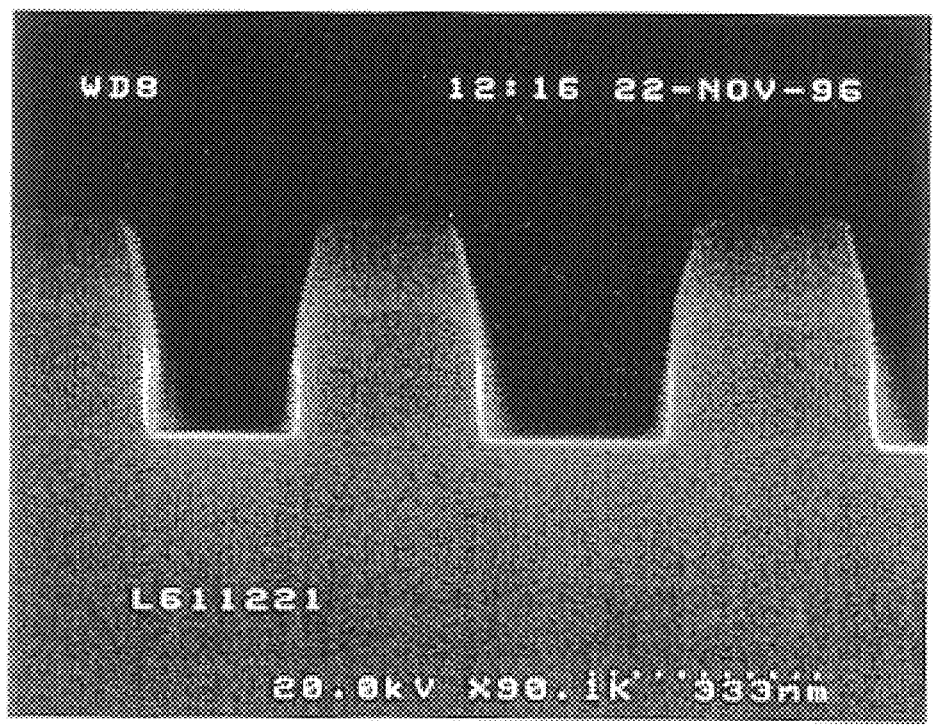

FIG. 5 (Example 1) and FIG. 6 (Example 2) show that, under similar conditions, using a Cl$_2$/N$_2$ mixture containing no HBr or O$_2$, it may be seen that there is no deformation of the side walls of the etched features, most especially for high germanium contents (equal to or greater than 75%).

The process herein described etching a stack that includes, a polycrystalline mixture of silicon and germanium, avoids deformation of the side walls of the etched features, even for high germanium contents.

The process is particularly suitable for forming a gate structure for CMOS semiconductor devices, that includes a polycrystalline Si$_{1-x}$Ge$_x$ layer deposited on a silicon oxide layer.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. Process for etching a layer of a polycrystalline $Si_{1-x}Ge_x$ [$(0<x\leq 1)$] $(0.5 \leq x \leq 1)$ mixture deposited on a substrate or for etching a stack comprising a first layer of a polycrystalline $Si_{1-x}Ge_x$ [$(0<x\leq 1)$] $(0.5 \leq x \leq 1)$ mixture deposited on a substrate and a second silicon layer deposited on the first layer, the said layer or the said stack including, on its surface, a mask of inorganic material, comprising a main etching of the said layer or the said stack in which the said $Si_{1-x}Ge_x$ layer or the said stack is anisotropically etched, using the said mask, by means of a high-density gas plasma of a gas mixture comprising chlorine ($Cl_2$) and either nitrogen ($N_2$) or ammonia ($NH_3$) or a nitrogen/ammonia mixture.

2. Process according to claim 1, it further comprising after the main etching of the said layer or the said stack, overetching of the said layer or the said stack using a high-density gas plasma of a gas mixture comprising $Cl_2$ and $N_2$ or $NH_3$.

3. Process according to claim 1 or 2, wherein the main etching of the said layer or the said stack is stopped before the substrate is reached.

4. Process according to claim 3, wherein the main etching of the said layer or the said stack is stopped 30 to 40 nm before the substrate is reached.

5. Process according to claim 1, wherein the said layer of $Si_{1-x}Ge_x$ material or the said stack is etched by means of a high-density plasma of a gas mixture comprising $Cl_2$, $N_2$ or $NH_3$.

6. Process according to claim 1, wherein the second layer of the stack is a polycrystalline Si layer.

7. Process according to claim 1, wherein the substrate is a silicon oxide layer deposited on a silicon wafer.

8. Process according to claim 7, wherein the etched stack or $Si_{1-x}Ge_x$ layer constitutes a gate structure of a CMOS semiconductor device.

9. Process for etching a layer of a gate structure material comprising a polycrystalline $Si_{1-x}Ge_x$ $(0<x \leq 1)$ mixture deposited on a substrate, comprising:

forming a mask of inorganic material upon a portion of the layer of the gate structure material; and anisotropically etching an unmasked portion of the layer of the gate structure material using a high-density gas plasma of a gas mixture comprising chlorine ($Cl_2$) and ammonia ($NH_3$).

10. The process of claim 9, wherein the gate structure material further comprises a layer of polycrystalline silicon.

11. The process of claim 9, further comprising overetching using a high-density gas plasma comprising chlorine ($Cl_2$) and ammonia ($NH_3$).

12. The process of claim 11, wherein the overetching high density gas plasma further comprises oxygen.

13. The process of claim 11, wherein the bias power applied to the substrate holder during anisotropic etching is substantially greater than the bias power applied during overetching.

14. The process of claim 9, wherein the gas mixture further comprises nitrogen ($N_2$).

15. The process of claim 9, wherein the gate structure material is doped with boron.

16. The process of claim 9, wherein the gate structure material is doped with phosphorus.

17. The process of claim 9, wherein the substrate comprises a silicon oxide layer deposited on a silicon wafer.

18. Process for etching a layer of a gate structure material comprising a polycrystalline $Si_{1-x}Ge_x$ $(0.5 \leq x \leq 1)$ mixture deposited on a substrate, comprising:

forming a mask of inorganic material upon a portion of the layer of the gate structure material; and anisotropically etching an unmasked portion of the layer of the gate structure material using a high-density gas plasma of a gas mixture comprising chlorine ($Cl_2$) and nitrogen ($N_2$).

19. The process of claim 18, wherein the gate structure material further comprises a layer of polycrystalline silicon.

20. The process of claim 18, further comprising overetching using a high-density gas plasma comprising chlorine ($Cl_2$) and ammonia ($N_2$).

21. The process of claim 20, wherein the overetching high density gas plasma further comprises oxygen.

22. The process of claim 20, wherein the bias power applied to the substrate holder during anisotropic etching is substantially greater than the bias power applied during overetching.

23. The process of claim 18, wherein the gas mixture further comprises ammonia ($NH_3$).

24. The process of claim 18, wherein the gate structure material is doped with boron.

25. The process of claim 18, wherein the gate structure material is doped with phosphorus.

26. The process of claim 18, wherein the substrate comprises a silicon oxide layer deposited on a silicon wafer.

* * * * *

UNITED STATES PATENT AND TRADEMARK OFFICE
CERTIFICATE OF CORRECTION

PATENT NO. : 6,271,144 B1  
DATED : August 7, 2001  
INVENTOR(S) : Monget et al.

Page 1 of 1

It is certified that error appears in the above-identified patent and that said Letters Patent is hereby corrected as shown below:

<u>Column 7,</u>  
Line 31, please delete "it" before the word further.

Signed and Sealed this

Seventh Day of May, 2002

Attest:

Attesting Officer

JAMES E. ROGAN  
*Director of the United States Patent and Trademark Office*